United States Patent [19]
Allen et al.

[11] Patent Number: 5,243,554
[45] Date of Patent: Sep. 7, 1993

[54] WRITABLE ANALOG REFERENCE VOLTAGE STORAGE DEVICE

[75] Inventors: Timothy P. Allen, Los Gatos; Adam K. Greenblatt, San Jose; Carver A. Mead, Pasadena; Janeen D. W. Anderson, Fremont, all of Calif.

[73] Assignee: Synaptics, Incorporated, San Jose, Calif.

[21] Appl. No.: 961,785

[22] Filed: Oct. 15, 1992

Related U.S. Application Data

[63] Continuation of Ser. No. 697,410, May 9, 1991, Pat. No. 5,166,562.

[51] Int. Cl.[5] ................................. G11C 7/00
[52] U.S. Cl. ....................... 365/45; 365/177; 365/182; 365/185; 307/571; 307/296.1; 257/316; 257/318; 257/221
[58] Field of Search ................. 365/45, 182, 185, 177; 307/464, 571, 296.1; 257/315, 316, 318, 321

[56] References Cited

U.S. PATENT DOCUMENTS

| | | | |
|---|---|---|---|
| 4,276,615 | 6/1981 | Kuhnel | 365/45 |
| 4,953,928 | 9/1990 | Anderson et al. | 257/315 |
| 5,028,810 | 7/1991 | Castro et al. | 307/464 |

Primary Examiner—Joseph E. Clawson, Jr.
Attorney, Agent, or Firm—Kenneth D'Alessandro

[57] ABSTRACT

A circuit for generating N analog voltage signals for reference or bias use employs N analog floating gate storage devices. Electron injection circuitry is provided for injecting electrons on to and a tunneling structure is provided for removing electrons from the floating gate of each floating gate storage device. A follower amplifier is connected to each floating gate storage device and drives an analog output voltage bus. A capacitor is connected to each analog output storage bus. An analog pass gate is connected between each analog output voltage bus and a common monitor/dynamic load bus. Each analog pass gate is driven by a strobe signal.

16 Claims, 3 Drawing Sheets

WRITABLE ANALOG REFERENCE VOLTAGE STORAGE DEVICE

RELATED APPLICATIONS

This application is a continuation of co-pending application Ser. No. 07/697,410, filed May 9, 1991, now U.S. Pat. No.. 5,166,562.

BACKGROUND OF THE INVENTION

1. Field Of The Invention

The present invention relates to integrated circuit technology. More particularly, the present invention relates to a writable analog reference storage device circuit for inclusion on an integrated circuit.

2. The Prior Art

Integrated circuit pin count translates directly into cost per packaged integrated circuit in terms of packaging and circuit board space. There is thus a need to maintain low pin counts on production integrated circuits. Because of the competing consideration to maximize functionality of the integrated circuit, maintaining a low pin count presents a challenge to the integrated circuit designer.

For example, a particular challenge exists in designing analog and mixed analog-digital integrated circuits which require analog voltage references and bias signals. In the prior art, use has been made of dynamic circuits for storing and periodically refreshing analog voltages in an on-chip circuit, such as a sample/hold circuit. However, this approach requires off-chip memory and digital-to-analog converter circuits, or the like. In addition, the dynamic refresh cycle clocking needed for such circuits generates additional on-chip noise which must be dealt with if dynamic refresh schemes are contemplated. An alternative solution which may be employed to provide on-chip voltage references and bias voltages utilizes on-chip EEPROMs and digital-to-analog converters. This solution, however, requires allocation of valuable chip area to accommodate the additional circuitry.

There is thus a need for circuitry which can provide on-chip analog reference and bias voltages without requiring use of an unacceptably large number of chip I/0 pins or requiring significant additional on-chip or off-chip circuitry.

BRIEF DESCRIPTION OF THE INVENTION

According to a first aspect of the present invention, a circuit for generating N analog voltage signals for reference or bias use employs N analog floating gate storage devices. Means are provided for injecting electrons on to and removing electrons from each floating gate storage device. A follower amplifier is connected to each floating gate storage device and drives an analog output voltage bus. A capacitor is connected to each I analog output storage bus. An analog pass gate is connected between each analog output voltage bus and a common monitor/dynamic load bus. Each analog pass gate is driven by a strobe signal.

The state register block is a digital selection representation which can be implemented in several different ways, each having a different I/0 pin count requirement. For a direct addressing selection scheme, the pin requirement is proportional to $\log_2(N)$, where N is the number of storage devices. For a shift register selection scheme, the pin requirement is independent of the number of storage devices. There are modes of operation where it is useful to have simultaneous selection of circuits. It is therefore preferable to use a digital selection scheme which allows one or more circuits to be simultaneously selected.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

U.S. Pat. No. 4,953,928 is expressly incorporated herein by reference. U.S. Pat. No. 5,059,920, issued Oct. 20, 1990 is also expressly incorporated herein by reference.

A circuit for providing on-chip analog reference and bias voltages according to the present invention is built around one or more analog floating gate devices including means for placing electrons onto and removing electrons from the floating gate. Numerous floating gate structures having this ability are disclosed in U.S. Pat. No. 5,059,920. An example of such a floating gate device is shown schematically in FIG. 1a. The floating gate device of FIG. 1a is also shown in top view and in cross sectional view, respectively, in FIGS. 1b and 1c—1d.

Figure 1A:
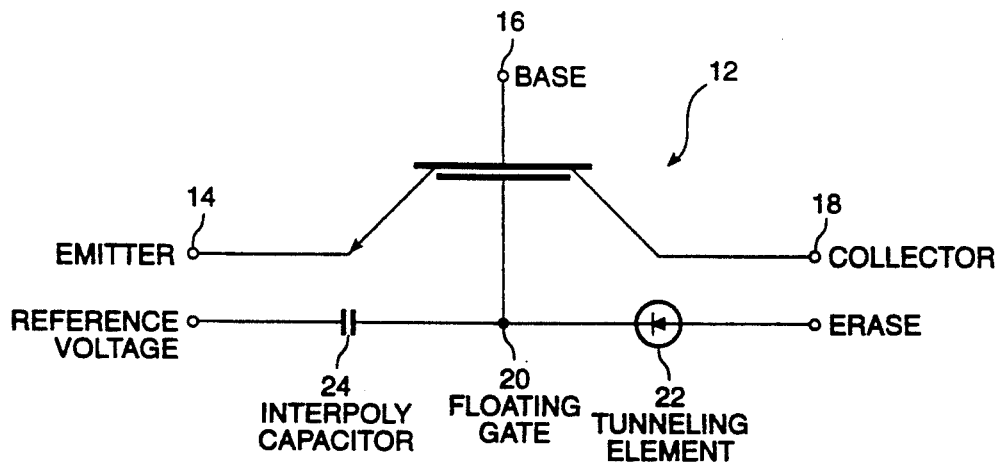
FIG. 1a is a schematic diagram of an illustrative analog floating gate device used in a presently preferred embodiment of the invention.

Referring to FIG. 1a, an analog floating gate device 10 includes both a hot-electron injection device 12, symbolically represented as a bipolar transistor including an emitter 14, base 16, and collector 18. As shown in FIG. 1a, floating gate 20 is associated with hot electron injection device 12. Analog floating gate device 10 also includes a tunnelling element 22 connected between an erase circuit node and floating gate 20, and a capacitor 24 connected between floating gate 20 and a reference voltage.

Figure 1B:
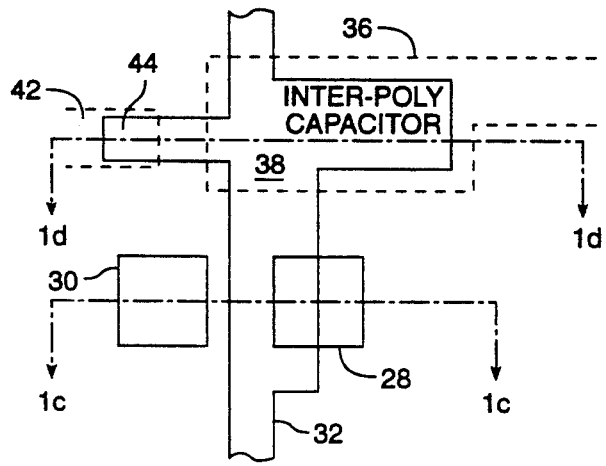
FIG. 1b is a top view of the circuit of FIG. 1a realized in silicon.
Figure 1C:
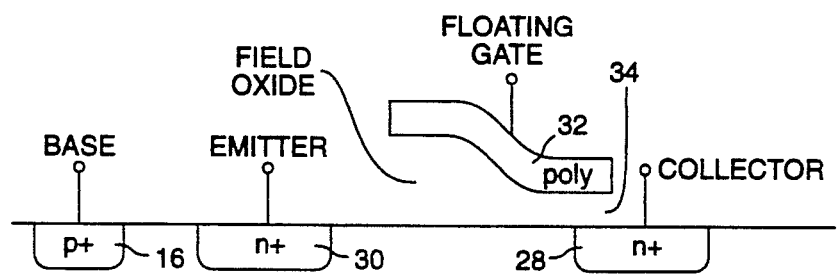
FIGS. 1c and 1d are cross sectional views of the circuit structure shown in FIG. 1b taken through lines 1c—1c and 1d—1d, respectively.
Figure 1D:
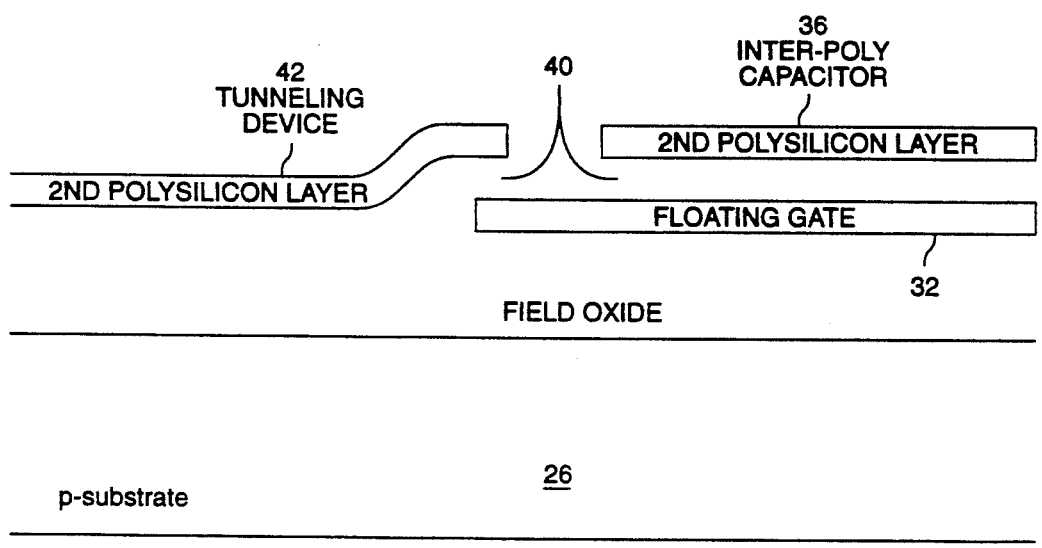

As is disclosed in U.S. Pat. No. 4,953,928, and as is shown in FIGS. 1b, 1c, and 1d, analog floating gate device 10 is formed in a p-type semiconductor substrate 26. First and second spaced-apart n-type regions 28 and 30 are disposed in substrate 26. A polysilicon floating gate 32 is separated from the surface of substrate 26 by a layer of insulating material 34, such as a gate oxide. One edge of polysilicon floating gate 32 is aligned with the edge of the first n-type region 28 such that polysilicon floating gate 32 does not lie appreciably over first n-type region 28. Since the border of first n-type region 28 defines the field edge, the portion of floating gate 32 lying over first n-type region 28 will be separated from the surface of substrate 26 by a layer of gate oxide 34, while the remainder of floating gate 32 will be separated from the surface of substrate 26 by a thicker layer of field oxide. Second n-type region 30 lies beyond the edge of the polysilicon floating gate 32. The first n-type region 28, the p-type substrate 26, and the second n-type region 30 form the collector, base, and emitter, respectively, of a lateral bipolar transistor.

A first portion 36 of a second polysilicon layer overlies a large portion 38 of floating gate 32. First portion 36 of the second polysilicon layer is separated from floating gate 32 by a layer of interpoly oxide 40 as is known in the art and is thus capacitively coupled to floating gate 32. First portion 36 of the second polysilicon layer is used to hold floating gate 32 at a desired potential by capacitive coupling.

A second portion 42 of the second polysilicon layer overlies a smaller portion 44 of floating gate 32 than does first portion 36 of the second polysilicon layer and is also separated from floating gate 32 by a layer of interpoly oxide 40. This second portion 42 of the second polysilicon layer may, when biased to a high positive voltage (typically 10 v positive with respect to floating gate 32 for a 400Å interpoly oxide thickness) elicit electron tunneling from floating gate 32, thereby charging it to a more positive potential.

A similar structure may be formed using a p-well in an n-type semiconductor substrate containing a single n-type region in which the substrate, the well, and the n-type region, respectively, form the emitter, base, and collector of a bipolar transistor. In this embodiment, one edge of the floating gate is aligned with the edge of the n-type region such that the floating gate does not lie appreciably over the n-type region. Those of ordinary skill int he art will recognize that the hot-electron injection devices described herein and in U.S. Pat. Nos. 4,953,920, including the prior art split-gate device described in U.S. Pat. No. 4,953,928, do not employ avalanche breakdown mechanisms as part of their injection physics and are therefore known int eh art as non-avalanche hot-electron injection devices. The details and operation of both embodiments will be understood by those of ordinary skill in the art from the description herein and are set forth in detail in U.S. Pat. No. 4,953,928.

Figure 2:
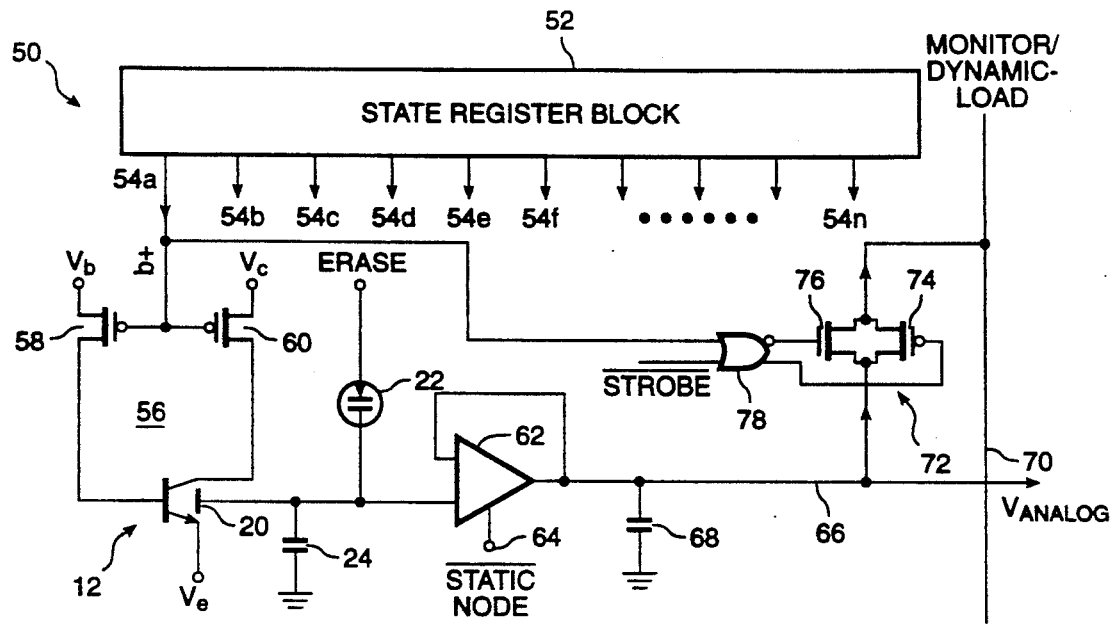
FIG. 2 is a combination block/schematic diagram of a circuit for providing a plurality of analog voltages on an integrated circuit chip according to the present invention.

Referring now to FIG. 2, a circuit 50 for providing a plurality of analog voltages on an integrated circuit chip according to the present invention is shown in a combination block/schematic diagram. Circuit 50 includes a digital control block 52 having a plurality of outputs 54a, 54b, 54c, . . . 54n, and at least one analog voltage generating circuit 56.

Each analog voltage generating circuit 56 includes hot electron injection device 12 and tunneling device 22, such as the one shown in FIG. 1a. A first P-channel MOS transistor 58 is connected between a circuit node $V_b$ and the base of hot electron injection device 12. The gate of first P-channel MOS transistor 58 is connected to output 54a of register 52. A second P-channel MOS transistor 60 is connected between a circuit node $V_c$ and the collector of the hot electron injection device 12. The gate of second P-channel MOS transistor 60 is connected to output 54a of register 52. The emitter of hot electron injection device 12 is connected to a circuit node $V_e$. Tunneling element 22 is connected between the floating gate 20 and a global ERASE signal node.

A capacitor 24 preferably having a magnitude of about 0.5 pf or greater is associated with the floating gate 20 of the analog floating gate device 10. One electrode of the capacitor 24 is floating gate 20. The other electrode of the capacitor 24 is first portion 34 of second polysilicon layer 36 and is connected to a fixed reference voltage. The choice of magnitude of reference voltage is dependent on the required reference for the output voltage (usually $V_{DD}$ or ground). The floating gate 20 of analog floating gate device 10 is connected to the input of a follower circuit 62. The bias input 64 of follower circuit 62 is connected to a STATIC control circuit node. The output of follower circuit 64 drives a $V_{analog}$ line 66, onto which the analog voltage is presented for use by on-chip circuits.

The $V_{analog}$ line of each analog voltage generating circuit 56 is connected to a common monitor/dynamic load line 70 through a conventional pass gate 72 comprising a P-channel MOS transistor 74 and an N-channel MOS transistor 76. Pass gate 72 is driven from gate 78 having both a NOR and an OR output for oppositely driving the gates of both MOS transistors. One input of gate 78 is driven from output 54a of register 52 and the other input of gate 78 is driven from a STROBE! input.

In an integrated circuit including a plurality of analog voltage generating circuits 56, the $V_b$, $V_c$, and $V_e$, and ERASE circuit nodes are preferably common to each voltage generating circuit and are brought to input/output pins of the integrated circuit. A clock pin and a set/reset pin for the digital control block 52 are also provided on the integrated circuit. The only other input/output pins required on the integrated circuit are the pins necessary to address select all digital control block outputs 54a—54n.

The circuits according to the present invention may be operated as described herein. Prior to programming any of the analog voltage generating circuits 56, a global erase signal placed on global ERASE signal node allows the floating gate voltage to be set to a nonspecific medium high voltage of about 5 volts in preparation for subsequent write. This operation is equivalent to a global erase or reset. An inter-poly tunneling device 22 as described with respect to FIGS. 1b, 1c, and 1d is used to achieve this erased state. When the global Erase line is taken to a high voltage of about 15 volts, electrons will be removed from the floating gate in the manner described in U.S. Pat. No 4,953,928. Once the floating gates have been erased, the global reset signal is returned to ground. Since, to erase, it is only necessary to set the floating gate to about 5 volts, any means for increasing the floating gate voltage could be used in place of tunnelling. For example, the floating gates could be erased by exposing the floating gate to ultraviolet light as is well known in the art. If this method were to be used, the inter-poly tunneling device would be replaced by an ultraviolet coupling device. Such a device could consist of an exposure window transparent to ultraviolet light positioned above the floating gate and a reference node disposed in the diffusion layer or second polysilicon layer and isolated from the floating gate by a dielectric layer such as a thermal oxide. The reference node should laterally overlap the floating gate by the minimum amount allowed by process design rules.

To write a voltage onto an erased floating gate 20, $V_c$ should be about $-5$ V, $V_c$ should be about 0V, such that the rate of injection of electrons onto floating gate 20 is independent of the floating gate voltage over the useful range of about 0–5 volts. Under these conditions, the injection rate is a function of the base current. The register 52 selects the desired floating gate for programming by placing a logic zero signal on the selected output line or lines 54a—54n and thus to the gates of P-channel MOS transistors 58 and 60. With 0v on the gate of P-channel MOS transistor 58, $V_b$ can be used to determine $V_{GS}$ and hence control the hot electron injection rate by determining the current flowing into the base of hot electron injection device 12. It can be desireable to program the floating gate circuits in parallel and deselect each circuit as it reaches its desired voltage. It will be obvious to those of ordinary skill in the art that this mode of operation will introduce power consumption constraints on the setting of $V_b$.

While this injection occurs in those circuits with OV presented on the gates of P-channel transistors 58 and 60, very small currents will flow in those analog voltage generating circuits 56 with 5 V on the gates of P-channel transistors 58 and 60 due to junction and channel leakage flowing into their base, on the order of $1 \times 10^{-14}$ amps. However, with $V_c$ disconnected from the collector of analog floating gate device 10, the potential of the collector will be pulled down to below that necessary for a favorable injection condition; essentially no injection will take place.

The floating gate is also connected to follower 62, whose bias is controlled by a state bit STATIC such that when STATIC is true the voltage stored on the floating gate appears on output line $V_{analog}$. As will be apparent to those of ordinary skill in the art, follower amplifier 64 must be designed with sufficiently low output impedance to drive whatever load is connected to $V_{analog}$.

When STROBE signal is true, the selected circuit can be externally monitored to see if its desired voltage has been written. While monitoring $V_{analog}$, $V_b$, $V_c$, and $V_e$ should be connected to ground in order to account for base and collector coupling to the floating gate through the hot-electron injection analog floating gate device 10. When all floating gates have been written, $V_b$, $V_c$, and $V_e$ should be grounded. When STATIC is false, source follower amplifier 64 is not driving the $V_{analog}$ line. With STATIC false, voltages can be sampled and held on the $V_{analog}$ line from the monitor/dynamic load line 70 in order to dynamically determine the optimal voltage for $V_{analog}$. This mode of operation is best suited for $V_{analog}$ signals connected to high impedance loads. Capacitor 68 serves as the dynamic storage node.

The circuit described has four meaningful modes of operation determined by the state of the pass gate and the follower amplifier. In a first mode, the follower amplifier is enabled and the pass gate is enabled. This mode may be used to monitor the $V_{analog}$ signal during programming for testing and characterization purposes, or to interrogate the $V_{analog}$ line after programming to determine that the desired voltage has been reached.

In a second mode, the follower amplifier is enabled and the pass gate is disabled. This is the mode for normal circuit use.

In a third mode, the follower amplifier is disabled and the pass gate is enabled. This mode may be used for sampling, and for dynamically refreshing a driven voltage onto the capacitor connected to the $V_{analog}$ line.

In a fourth mode, both the follower amplifier and the pass gate are disabled. In this mode, a dynamically stored value is held between refresh cycles.

In all four of these modes, it is critical that only one follower amplifier is connected to the monitor/dynamic load line. Hence, in these modes of operation,, the digital selection circuitry should enable only one of the lines 54a-54n at any one time.

According to a second aspect to the invention, a single floating gate storage circuit can be used to generate a P-channel MOS transistor bias signal and an N-channel MOS transistor bias signal, as well as the reference voltage output on $V_{analog}$. This arrangement may be understood with reference to FIG. 3.

Figure 3:
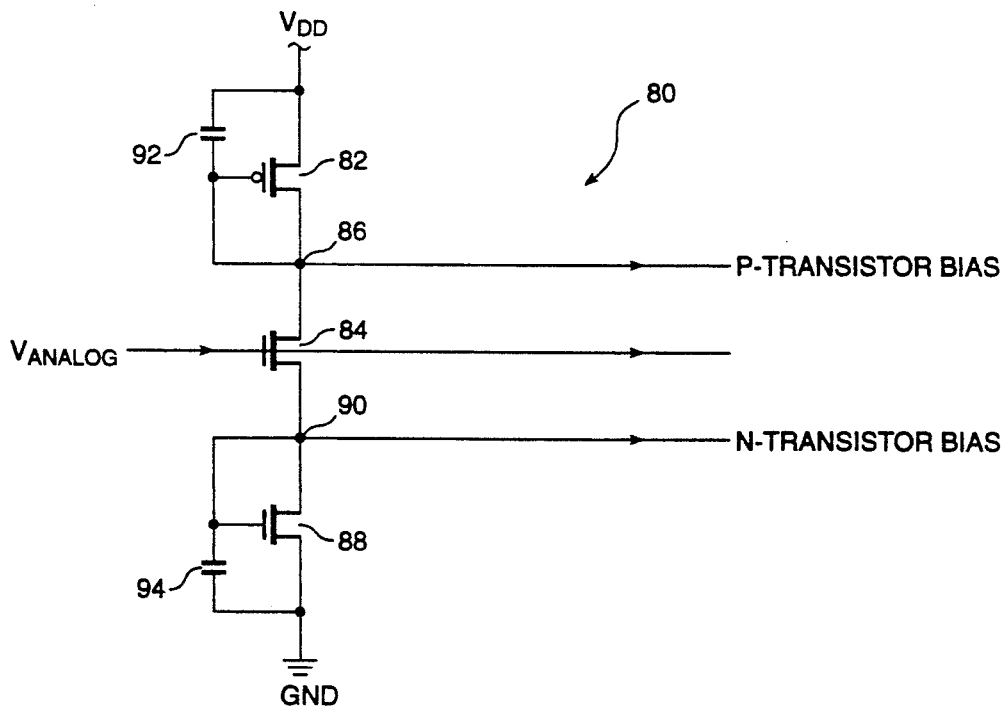
FIG. 3 is a schematic diagram of a circuit for generating a P-channel MOS transistor current reference and an N-channel MOS transistor current reference according to the present invention.

The bias circuit 80 of FIG. 3 includes a P-channel MOS transistor 82 having its source connected to the first power supply rail $V_{DD}$, and its gate and drain connected to the drain of an N-channel MOS transistor 84 having its gate connected to $V_{analog}$. The common drain connections of transistors 82 and 84 comprises the P-channel transistor current reference output 86.

An N-channel MOS transistor 88 has its drain and gate connected to the source of N-channel MOS transistor 84 and its source connected to the second power supply rail ground. The connection between the drain of transistor 88 and the source of transistor 84 comprises the N-channel transistor current reference output 90. Those of ordinary skill in the art will recognize that either a P-channel MOS transistor or an N-channel MOS transistor could be used as MOS transistor 84. The choice of transistor type is a function of the level of $V_{analog}$ and the desired value of current for the current reference. If transistor 84 is an N-channel MOS transistor, capacitor 68 should be referred to the negative power supply rail. If transistor 84 is an P-channel MOS transistor, capacitor 68 should be referred to the positive power supply rail.

A first capacitor 92 is connected between $V_{DD}$ and the P-channel transistor bias output 86, and a second capacitor 94 is connected between the N-transistor bias output 90 and ground. These capacitors are used to provide power supply rejection for circuits using these bias signals.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit disposed on a semiconductor substrate for generating an analog voltage signal in a semiconductor integrated circuit disposed on said semiconductor substrate, including:

an analog floating gate storage device disposed on said semiconductor substrate, said analog floating gate storage device including a floating gate connected to a stabilizing capacitor, and a non-avalanche hot electron injection device including a collector connected to a first voltage node, an emitter connected to a second voltage node and a base connected to a third voltage node;

an electron tunneling device coupled to said floating gate for removing electrons from said floating gate, an analog output voltage bus; and a high input impedance follower amplifier having an input connected to said floating gate and an output connected to said analog output voltage bus.

2. The circuit of claim 1 wherein said analog output voltage bus has a capacitance associated therewith, said capacitance having a value greater than the inherent capacitance associated with said bus and further including means for turning off the output of said follower amplifier.

3. The circuit of claim 2, further including:
a monitor/dynamic load line;
an analog pass gate connected between said analog output voltage bus and said monitor/dynamic load line; and
means for providing a strobe signal to said analog pass gate.

4. The circuit of claim 1, further including:
a diode-connected P-channel MOS transistor having a source connected to a first voltage rail, said diode-connected P-channel MOS transistor having a capacitor connected between its gate and source;
an N-channel MOS transistor having its gate connected to said analog output voltage bus and its source connected to the drain of said diode connected P-channel MOS transistor.

5. The circuit of claim 1, further including:
a diode-connected N-channel MOS transistor having a source connected to a second voltage rail, said diode-connected N-channel MOS transistor having a capacitor connected between its gate and source;
an MOS transistor having its gate connected to said analog output voltage bus and its source connected to the drain of said diode-connected N-channel MOS transistor.

6. The circuit of claim 3, further including a diode-connected N-channel MOS transistor having a source connected to a second voltage rail, and a drain connected to the source of said MOS transistor, said diode connected N-channel MOS transistor having a capacitor connected between its gate and source.

7. The circuit of claim 5, wherein said MOS transistor is an N-channel MOS transistor.

8. The circuit of claim 6, wherein said MOS transistor is an N-channel MOS transistor.

9. A circuit disposed on a semiconductor substrate for generating N analog voltage signals in a semiconductor integrated circuit disposed on said semiconductor substrate, including:
N analog floating gate storage devices disposed on said semiconductor substrate, each of said analog floating gate storage devices including:
a select node,
a first P-channel MOS transistor, having a source connected to a first voltage source, a drain, and a gate connected to said select node,
a second P-channel MOS transistor, having a source connected to said a second voltage source, a drain, and a gate connected to said select node,
a floating gate connected to a stabilizing capacitor,
a non-avalanche hot electron injection device including a collector connected to the drain of said first P-channel MOS transistor, a base connected to the drain of aid second P-channel MOS transistor, an emitter connected to a third voltage node, and an insulated gate disposed above said base, said insulated gate self aligned with said collector and not overlapping said emitter, said insulated gate connected to said floating gate,
an electron tunneling device coupled to said floating gate for removing electrons from said floating gate, and
wherein said first, second, and third voltage sources are selected so as to cause non-avalanche hot electron injection onto said floating gate;
addressing means for activating selected ones of said select nodes so as to turn on their first and second P-channel MOS transistors:
an analog output voltage bus; and
a high input impedance follower amplifier having an input connected to said floating gate and an output connected to said analog output voltage bus.

10. The circuit of claim 9 wherein said analog output voltage bus has a capacitance associated therewith, said capacitance having a value greater than the inherent capacitance associated with said bus and further including means for turning off the output of said follower amplifier.

11. The circuit of claim 9, further including:
a monitor/dynamic load line;
an analog pass gate connected between said analog output voltage bus and said monitor/dynamic load line; and
means for providing a strobe signal to said analog pass gate.

12. The circuit of claim 9, further including:
a diode-connected P-channel MOS transistor having a source connected to a first voltage rail, said diode-connected P-channel MOS transistor having a capacitor connected between its gate and source;
an N-channel MOS transistor having its gate connected to said analog output voltage bus and its source connected to the drain of said diode connected P-channel MOS transistor.

13. The circuit of claim 9, further including:
a diode-connected N-channel MOS transistor having a source connected to a second voltage rail, said diode-connected N-channel MOS transistor having a capacitor connected between its gate and source;
an MOS transistor having its gate connected to said analog output voltage bus and its source connected to the drain of said diode-connected N-channel MOS transistor.

14. The circuit of claim 11, further including a diode-connected N-channel MOS transistor having a source connected to a second voltage rail, and a drain connected to the source of said MOS transistor, said diode connected N-channel MOS transistor having a capacitor connected between its gate and source.

15. The circuit of claim 13, wherein said MOS transistor is an N-channel MOS transistor.

16. The circuit of claim 14, wherein said MOS transistor is an N-channel MOS transistor.

* * * * *